United States Patent
Nomura et al.

(10) Patent No.: US 6,641,703 B2
(45) Date of Patent: Nov. 4, 2003

(54) MAGNETIC MULTI-LAYER FILM MANUFACTURING APPARATUS

(75) Inventors: Shuji Nomura, Tokyo (JP); Ayumu Miyoshi, Kanagawa-ken (JP); Koji Tsunekawa, Tokyo (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/996,772

(22) Filed: Nov. 30, 2001

(65) Prior Publication Data

US 2002/0064595 A1 May 30, 2002

(30) Foreign Application Priority Data

Nov. 30, 2000 (JP) ........................... 2000-365696

(51) Int. Cl.$^7$ .......................... C23C 14/34; B05D 5/12; B05C 11/11; B44C 1/22; B08B 6/00
(52) U.S. Cl. ............................ 204/192.12; 204/192.32; 204/298.11; 204/298.25; 204/298.26; 204/298.28; 427/128; 427/131; 427/132; 427/129; 427/130; 118/719; 118/600; 118/504; 216/22; 134/1; 134/11
(58) Field of Search ................................. 427/128, 131, 427/132, 129, 130; 204/192.1, 192.12, 192.32, 298.11, 298.25, 298.26, 298.28; 118/719, 600, 504; 216/22; 134/1, 1.1

(56) References Cited

U.S. PATENT DOCUMENTS 3,775,285 A * 11/1973 Lane ..................... 204/298.26
6,254,747 B1 * 7/2001 Hoshino et al. ........ 204/298.11

FOREIGN PATENT DOCUMENTS

WO          99/55932          11/1999      ........... C23C/14/56

OTHER PUBLICATIONS

JP 61–000576 English abstract.
JP 63–290721 English abstract.
JP 11–200042 English abstract.

* cited by examiner

Primary Examiner—Steven H. VerSteeg
(74) Attorney, Agent, or Firm—Burns, Doane, Swecker & Mathis, LLP

(57) ABSTRACT

A magnetic multi-layer film manufacturing apparatus has a transferring chamber, a plurality of film-depositing chambers, and a robotic transferring device. Each film-depositing chamber has a rotatable substrate holder, a plurality of targets positioned at an incline on an opposing interior surface from the substrate holder, and a double layer rotating shutter mechanism and is controllable to deposit at least one layer of a magnetic multi-layer film structure. Magnetic multi-layer film structures are formed by depositing a plurality of magnetic films divided into a plurality of groups, each one of the plurality of groups deposited in an associated one of the plurality of film-depositing chambers continuously in a laminated state. A first division between successive groups of magnetic films is between a metal oxide film and a magnetic layer continuous therewith and a second division is between an antiferromagnetic layer and a magnetic layer continuous therewith.

38 Claims, 6 Drawing Sheets

MAGNETIC MULTI-LAYER FILM MANUFACTURING APPARATUS

CROSS-REFERENCE TO RELATED APPLICATIONS

The present application claims the priority of JP 2000-365696, filed in Japan on Nov. 30, 2000, the entire contents of which are hereby incorporated herein by reference.

FIELD OF THE INVENTION

The present invention relates to a magnetic multi-layer film manufacturing apparatus.

BACKGROUND OF THE INVENTION

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

Magnetoresistive effect-type magnetic heads, which constitute playback magnetic heads in which a magnetoresistive effect element is employed as a magnet-sensitive element, have actual application as playback parts for hard disk drives and the like. TMR elements have begun to be employed in recent years as magnetoresistive effect elements used in magnetoresistive effect-type magnetic heads. TMR elements are elements that use a TMR (Tunneling Magnetoresistive) effect. The TMR effect is a magnetoresistive effect produced by tunnel junctions in which an insulating body is enclosed by a strong magnetic body. Compared to elements of the prior art that use an AMR (Anisotropic Magnetoresistive) effect and GMR (Giant Magnetoresistive) effect, TMR elements are advantageous in that they have a large MR ratio. The MR ratio thereof is 30 to 50%.

The films from which the above-described TMR elements are configured comprise, specifically, a multi-layer film structure in which a first soft magnetic layer, an insulating layer, a second soft magnetic layer, and an antiferromagnetic layer are deposited successively. In these TMR elements, film deposition is performed by the use of individual sputtering of the respective plurality of magnetic films, and the film formation of the insulating layer is performed using a metal oxide reaction.

As is described above, the conventional magnetic multi-layer film manufacturing apparatus, in which film layers of the multi-layer film are successively deposited on a substrate, performs continuous multi-layer film deposition. FIG. 6 shows a hitherto used representative sputtering film forming apparatus for heads. In this sputtering film depositing apparatus, a comparatively large single film-depositing chamber 103 is provided in the perimeter of a transferring chamber 102 which includes a robotic-transferring device 101. Targets 104A to 104J for the separate sputtering deposition of the various magnetic layers from which the magnetic layer films are configured, are provided in a circular arrangement in the inner part of the film-deposition chamber 103. A substrate carried in from a loading chamber 105 is introduced to the film-deposition chamber 103 by the robot carrying device 101 within the carrying chamber 102, whereupon the formation of the magnetic film layer on the substrate is performed. The manufacture of the magnetic multi-layer film is performed by sputtering film deposition in which the substrate is caused to move, by way of example, in a clockwise direction, and is stopped, by the movement thereof, below each of the targets 104A to 104J. The magnetic multi-layer film is manufactured on the substrate using the single film-deposition chamber 103, in accordance with targets arranged in an order established in advance, by the continuous successive film deposition of all of the magnetic film layers from a bottom layer in accordance with a set order. In this sputtering film deposition, normally, the targets are arranged horizontally, and the surface of the substrate is arranged in an opposing state with respect to the surface of said targets. When the continuous multi-layer film depositing of the magnetic multi-layer films—which use the plurality of targets 104A to 104J correspondent to the number of layers of multi-layer magnetic films in the film-depositing chamber 103—is completed, the substrate in which the film-depositing process has been completed is carried along by the robot transferring device 101 of the transferring chamber 102, and is carried out through an unloading chamber 106.

In the above-described conventional continuous multi-layer film deposition of the magnetic multi-layer film, because of the configuration of the sputtering film depositing apparatus, deposition is performed, without interruption of the film deposition, from the bottommost layer until completion of the film deposition of the uppermost layer. On the other hand, the configuration for the production of multi-layer films from which semiconductor devices are made is generally one which comprises a transferring chamber at the center and a plurality of film-depositing chambers provided in the perimeter thereof and, as a cluster-type, is one in which each of the multi-layer films are deposited using a plurality of film-depositing chambers. Compared to the configuration of the multi-layer film manufacturing apparatus pertaining to ordinary semiconductor devices, the configuration of a representative multi-layer sputtering film depositing apparatus of the prior art may be described as unique.

In the development of a sputtering film depositing apparatus for magnetic heads that is suitable for the mass production of magnetic heads for the abovementioned TMR elements that comprise magnetic multi-layer films, the adoption of a configuration that is compatible with the general configuration of a semiconductor device manufacturing apparatus, and not a unique configuration, is demanded.

In addition, there will be increased demand in the future for, as a non-volatile semiconductor memory, an MRAM (Magnetoresistive Random Access Memory) that comprises a magnetic multi-layer structure similar to TMR elements in terms of improvement to memory integration degree and high-speed rewriting performance. In cases where, in response to this demand, the manufacture of magnetic multi-layer films has been performed by manufacturers which ordinarily produce semiconductor devices using the conventional configuration of the apparatus in which the multi-layer film deposition is performed continuously using one large film-depositing chamber, a sense of incompatibility has been felt in comparison to normal semiconductor device manufacturing methods. Thereupon, the semiconductor manufacturers, in consideration of the manufacture of MRAM using their own semiconductor production lines, have come to demand a magnetic multi-layer film manufacturing apparatus comprising a configuration (cluster system) suitable for semiconductor production lines.

In addition, in the continuous film deposition of conventional magnetic multi-layer films, because the film deposition must be continuous, without interruption, from the bottommost layer of the substrate to the uppermost layer, and a large number of magnetic films are deposited in one action, concerns exist regarding the restricting of improvements to the MR ratio.

Furthermore, in the production of MRAM, greater productivity is demanded compared to the production of magnetic heads. Based on the representative configuration of the magnetic multi-layer film manufacturing apparatus of the prior art described above, it is difficult to expect productivity improvements because of the continuous multi-layer film deposition.

An objective of the present invention, which is designed with the above-noted problems in mind, lies in the provision of a magnetic multi-layer film manufacturing apparatus which, in the production of MRAM and magnetic heads comprising TMR elements and so on, comprises a normal configuration which, notably, is a configuration suitable for the deposition of magnetic multi-layer films by manufacturers of semiconductor devices, and in which, furthermore, the film performance can be increased and productivity can be improved.

SUMMARY

A magnetic multi-layer film manufacturing apparatus comprises a transferring chamber, a plurality of film-depositing chambers in operative communication with the transferring chamber, each film-depositing chamber comprising a rotatable substrate holder, a plurality of targets, and a double layer rotating shutter mechanism disposed between the rotatable substrate holder and the plurality of targets, each film-depositing chamber controllable to deposit at least one layer of a magnetic multi-layer film structure, and a robotic transferring device disposed in the transferring chamber, the robotic transferring device rotatable about a central location and freely stretchable.

A deposition apparatus comprises a chamber comprising at least one housing for a target on a first surface and a shutter mechanism, the shutter mechanism comprising a first platen having at least two openings therein aligned radially, and a second platen having one opening therein. The first platen and second platen are arranged substantially coaxial and are each freely and independently rotatable about an axis within the chamber such that one of the at least two openings in the first platen and the one opening in the second platen are substantially longitudinally aligned with respect to a center axis of the at least one housing for a target.

A method of forming a magnetic multi-layer film positions a substrate into a first film deposition chamber from a carrying chamber in operational communication therewith, deposits a first magnetic film group, the first magnetic film group comprising a first plurality of magnetic layers, each magnetic layer deposited successively on the substrate continuously in a laminated state to form a magnetic multi-layer film, positions the magnetic multi-layer film into at least a second film deposition chamber from the carrying chamber in operational communication therewith, and deposits at least a second magnetic film group, the at least second magnetic film group comprising a second plurality of magnetic layers, each magnetic layer deposited successively on the magnetic multi-layer film continuously in a laminated state to form a stacked magnetic multi-layer film.

Another method of forming a magnetic multi-layer film introduces a substrate into a carrying chamber having a plurality of deposition chambers in operational communication therewith and a manipulating device, operates the manipulating device to place the substrate in a cleaning chamber, cleans the substrate by an etching or a sputtering technique, operates the manipulating device to successively place the substrate in each of the plurality of deposition chambers in a predetermined sequence, and deposits a plurality of magnetic film groups to form a magnetic multi-layer film, the plurality of magnetic film groups comprising a plurality of magnetic film layers, each one of the plurality of magnetic film groups continuously deposited in a laminated state in an associated one of the plurality of deposition chambers.

A further method of depositing material from a plurality of targets in a chamber rotates a first platen having one opening to align the one opening with a first of a plurality of targets, rotates a second platen having at least two openings therein aligned radially to align a first of the two openings with other than a first of the plurality of targets, sputters the first of the plurality of targets for a predetermined time, rotates the second platen to align the first of the two openings with the first target, and deposits material from the first of the plurality of targets onto a substrate.

In a first aspect, which constitutes a magnetic multi-layer film manufactured by the successive deposition on a substrate, in a laminated state, of multi-layer films comprising a plurality of magnetic films, a plurality of magnetic films are divided into a plurality of groups and each of the plurality of groups comprises a plurality of magnetic films deposited continuously in a laminated state. The plurality of magnetic films contained in the plurality of groups are configured so as to be successively deposited on the substrate using the same film-depositing chamber.

Based on the above-described magnetic multi-layer film manufacturing apparatus, sputtering film deposition can be performed by the division of a multi-layer magnetic film into a plurality of groups in accordance with a specific reference criterion and, as a result, a magnetic multi-layer film manufacturing apparatus configuration comprising a large number of film-depositing chambers is attained. The attainment of a cluster system in the manufacture of a magnetic multi-layer film is concurrent with the methods used by manufacturers of semiconductors.

In a second aspect, it is preferable that the above-described configuration be provided with a single film-depositing chamber correspondent to each of the plurality of groups, and that it comprises a plurality of film-depositing chambers, the number of which is correspondent to the number of the groups. In the deposition of magnetic multi-layer films which can be divided into a plurality of groups, it is preferable that film deposition processing be performed for each group, wherein the plurality of magnetic films belonging to the groups are continuously deposited by the sputtering of a shared film-depositing chamber.

In a third aspect, it is preferable that, in the above-described configuration, the configuration comprises, in addition to the abovementioned plurality of film-depositing chambers for depositing the abovementioned magnetic films, a film-depositing chamber for the deposition of a film of another nature. Processing to form oxide films at stages along the way is necessary in magnetic multi-layer films, so a film-depositing chamber such as this is specially provided. As this is a cluster-type film manufacturing apparatus, another film-depositing chamber can be provided in the perimeter of the transferring chamber that is positioned in the center.

In a fourth aspect, it is preferable that, in the above-described configuration, the plurality of film-depositing chambers be configured in such a way as to be arranged in the perimeter of a transferring chamber positioned in the center which comprises a substrate transferring device. A cluster-system film manufacturing apparatus is attained, and this affords the merger with the semiconductor device methods.

In a fifth aspect, it is preferable that, in the above-described configuration, a plurality of targets correspondent to the plurality of magnetic films contained in the groups be arranged in the film-depositing chambers for depositing the plurality of magnetic films contained in the groups, and that the substrate be arranged in a rotating state in the center of the base surface of the film-depositing chamber, and that the plurality of targets be provided in an incline toward the substrate. For the deposition of a plurality of types of magnetic film by sputtering using a single film-depositing chamber, and for the efficient deposition of magnetic films of high performance, an oblique film-deposition configuration is preferred.

In a sixth aspect, it is preferable that, in the above-described configuration, a double-layer structure, comprising two shutter plates which rotate separately, be provided in the front surface of the abovementioned plurality of targets of the abovementioned film-deposition chamber. The cross-contamination between the targets provided on the same film-depositing chamber can be prevented by the provision of this double shutter structure.

In a seventh aspect, it is preferable that, for the formation of the plurality of groups in the above-described configuration, a group be formed by the division of a metal oxide layer and a magnetic layer continuous therewith contained in the above-described multi-layer films, and furthermore, an antiferromagnetic layer and a magnetic layer continuous therewith be taken as the same group and continuous film deposition be performed in the same chamber.

BRIEF DESCRIPTION OF THE DRAWING FIGURES

Other objects and advantages of the invention will become apparent from the following detailed description of preferred embodiments in connection with the accompanying drawings in which like numerals designate like elements and in which:

FIG. 1 is a plane surface view showing the configuration of a representative embodiment of a magnetic multi-layer film manufacturing apparatus pertaining to the present invention.

FIGS. 2(A), 2(B), and 2(C) are diagrams sowing three examples of magnetic multi-layer film laminated structure and the groupings (A, B, C) thereof.

Figure 5A:
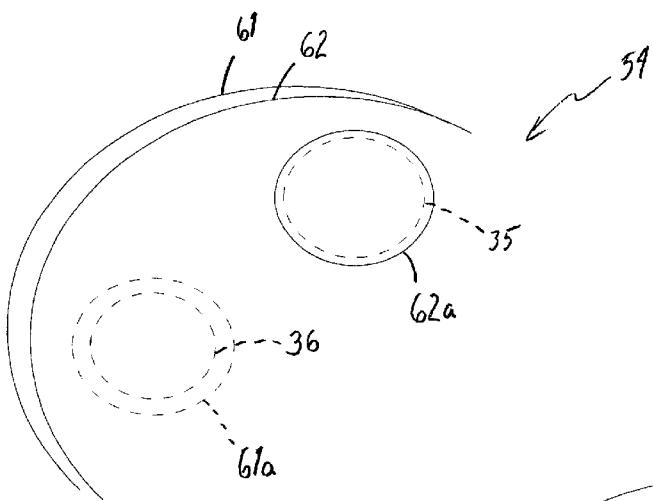
Figure 5B:
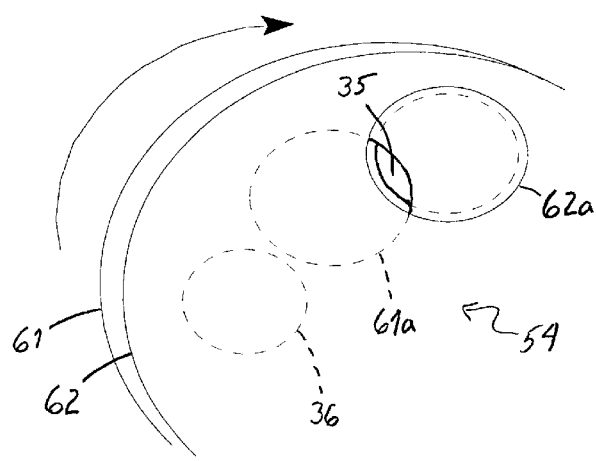
Figure 5C:
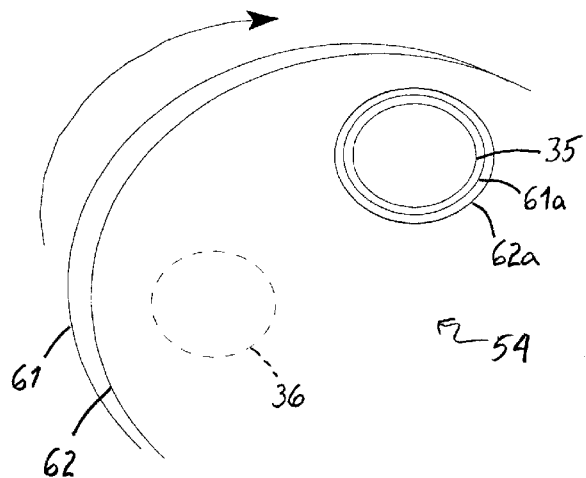

FIGS. 5(A)–(C) sequentially depict the position of the double shutter with reference to a target during operation.

Figure 6:
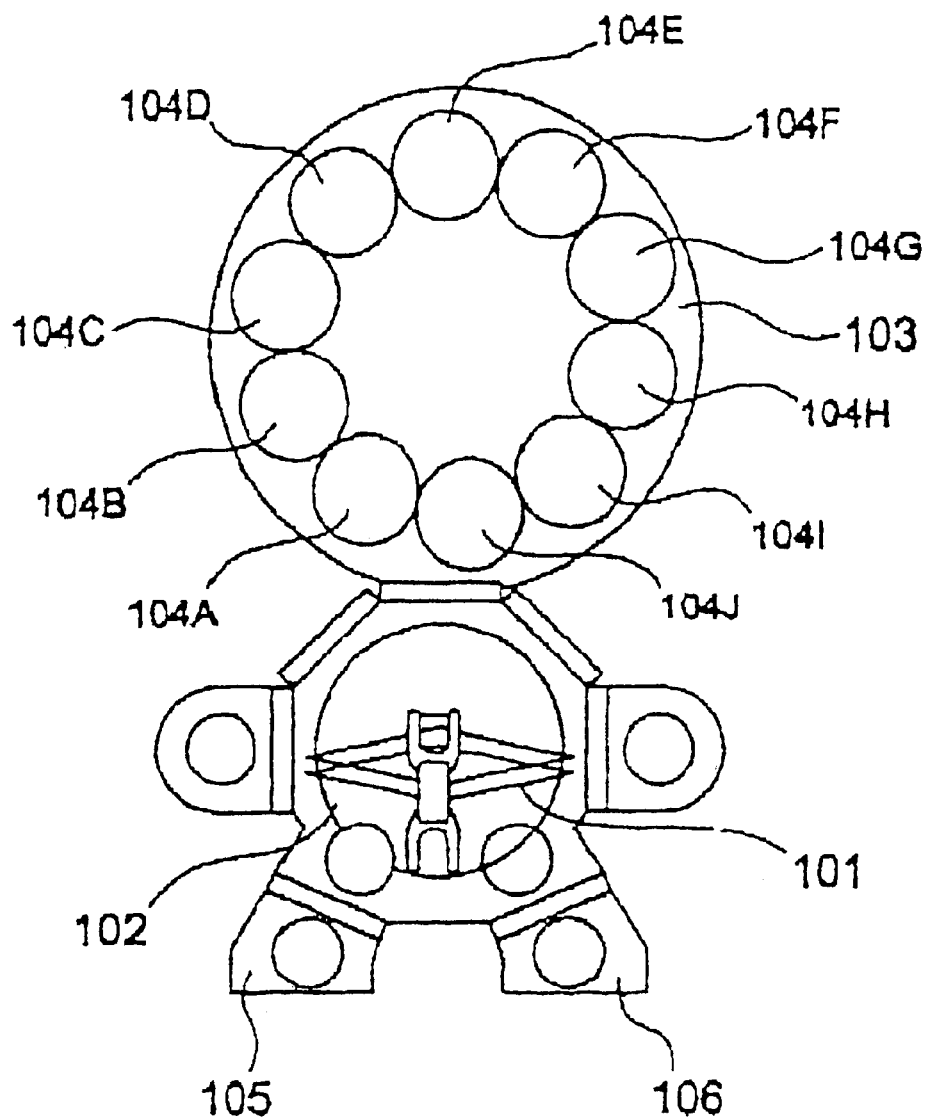

FIG. 6 is a plane surface view of a conventional representative magnetic multi-layer film manufacturing apparatus.

DETAILED DESCRIPTION OF THE PREFERRED EMBODIMENTS

A description is given below, with reference to the attached diagrams, of a preferred embodiment of the present invention.

Figure 1:
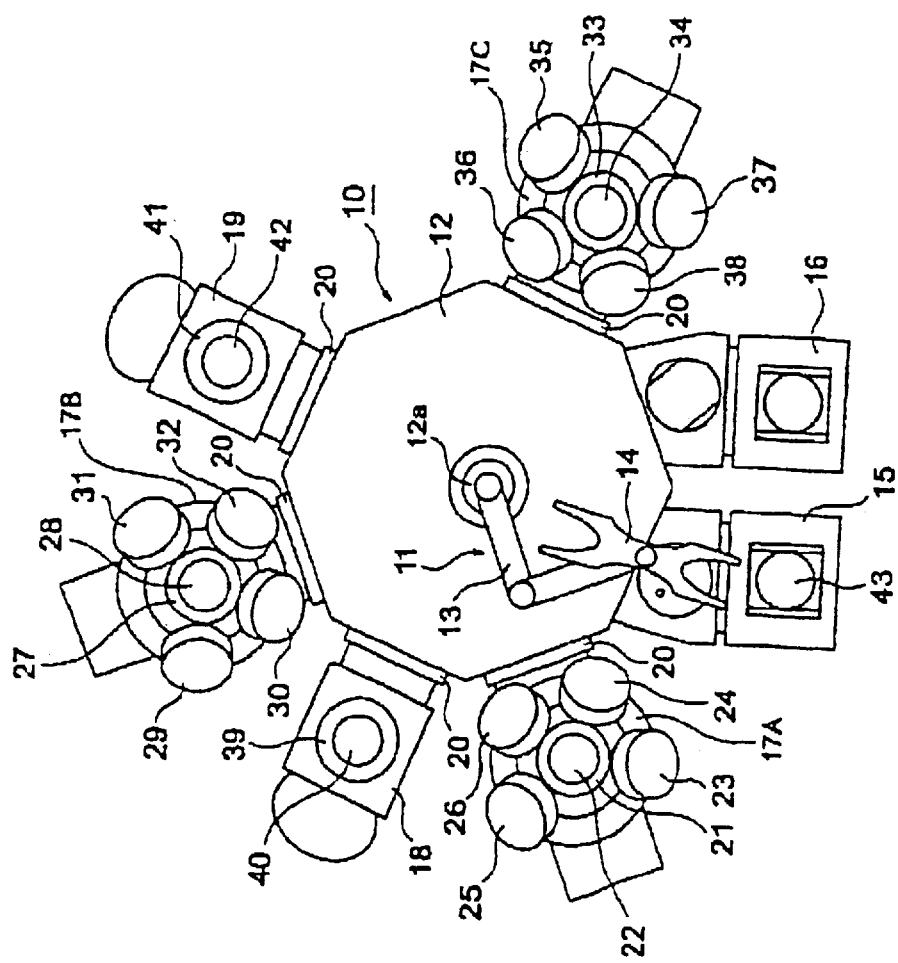

FIG. 1, which shows a representative configuration of a magnetic multi-layer film manufacturing apparatus pertaining to the present invention, is a plane surface view that provides clarification of the schematic configuration of the internal structure. A magnetic multi-layer film manufacturing apparatus 10—of a cluster-type—comprises a plurality of film-depositing chambers. A transferring chamber 12, in which is provided a robotic transferring device 11, is arranged in the center position. The robotic transferring device 11 comprises a freely stretchable arm 13, and a hand 14 for the mounting of substrates. The base-end part of the arm 13 is attached with freedom to rotate to a central part 12a of the transferring chamber 12.

Loading/unloading chambers 15, 16 are attached to the transferring chamber 12 of the magnetic multi-layer film manufacturing apparatus 10. The substrate for processing is carried from the exterior into the magnetic multi-layer film manufacturing apparatus 10, and the substrate on which the film-depositing processing of the magnetic multi-layer film has been completed is carried out to the exterior from the magnetic multi-layer film manufacturing apparatus 10 by means of the loading/unloading chamber 15. The loading/unloading chamber 16 has the same function, that is, the substrate is carried in by way of the loading/unloading chamber 16 and is carried out from the same chamber. The reason for the provision of two loading/unloading chambers is because the productivity can be increased by the alternating use of two chambers.

In the magnetic multi-layer film-manufacturing apparatus 10, three film-depositing chambers 17A, 17B and 17C, one oxide film film-depositing chamber 18, and one cleaning chamber 19, are provided in the perimeter of the transferring chamber 12. A freely opening gate valve 20, which segregates two chambers, is provided between two chambers in accordance with the need. It will be noted, by way of example, that a vacuum pump mechanism, source material gas-introducing mechanism, and power supply mechanism are fitted in each chamber, although the illustration thereof has been omitted.

The respective film-depositing chambers 17A, 17B and 17C constitute film-depositing chambers for the continuous film deposition within the same chamber of a plurality of magnetic films belonging to a group. The configuration based on this embodiment is such that magnetic multi-layer films deposited on the substrate are divided from the lower side into three groups, A, B and C, and the plurality of magnetic films of each group are deposited using a single common film-deposition chamber. As a result, a cluster-type magnetic multi-layer film-manufacturing apparatus is attained. Magnetic films are deposited by means of a PVD (Physical Vapor Deposition) method in which the grouping into A, B and C is performed and sputtering is used in the respective film-deposition chambers 17A, 17B and 17C to enable the deposition of a plurality of magnetic films belonging to these groups.

In the film-depositing chamber 17A for the deposition of magnetic films belonging to the group A, the magnetic films are deposited continuously in the predetermined order of, by way of example, Ta, NiFe or NiFeCr (Seed layer: this layer can be omitted), PtMn or PdPtMn or IrMn (Anti-ferro layer: antiferromagnetic layer) and CoFe. For this reason, in the film-depositing chamber 17A, for the substrate 22 arranged on a substrate holder 21 on the center of the base part thereof, four targets 23 to 26, correspondent respectively to Ta, NiFe or NiFeCr, PtMn or PdPtMn or IrMn, and CoFe, are fixed to a ceiling part. It will be noted that, in FIG. 1, the illustration of, for example, a reservoir vacuum pump structure for forming the desired vacuum state in the inner part of the film-depositing chamber 17A, a mechanism for supplying the power required for sputtering of the targets 23 to 26, and a mechanism for producing plasma, are omitted. This applies to the illustrations of the other film-depositing chambers as well.

In the film-depositing chamber 17B for the deposition of magnetic films belonging to the group B, the magnetic films are deposited continuously in a predetermined order of, by way of example, CoFe, Ru and Al. For this reason, in the film-depositing chamber 17B, in the same way as described above, for a substrate 28 arranged on a substrate holder 27 in the base part center thereof, targets 29 to 32 respectively correspondent to the CoFe, Ru and Al are fixed to the ceiling part.

In the film-depositing chamber 17C for the deposition of magnetic films belonging to the group C, the magnetic films are deposited continuously in the predetermined order of, by way of example, Ta, NiFe or NiFeCr, PtMn or PdPtMn or IrMn, and CoFe. For this reason, in the film-depositing chamber 17C, in the same way as described above, for a substrate 34 arranged on a substrate holder 33 in the base part center thereof, targets 35 to 38 respectively correspondent to the Ta, NiFe or NiFeCr, PtMn or PdPtMn or IrMn, and CoFe, are fixed to the ceiling part.

In the oxide film film-depositing chamber 18, a surface chemical reaction is performed which oxidizes a metal layer. Plasma oxides, natural oxides, ozone oxides, ultraviolet light—ozone oxides, and radical oxygens and so on are used in this surface chemical reaction. In the oxide film film-depositing chamber 18, the reference number 39 refers to a substrate holder and the reference number 40 refers to a substrate.

An ion beam etching mechanism and RF sputtering mechanism are provided in the cleaning chamber 19, wherein surface smoothing is performed. In the cleaning chamber 19, the reference number 41 refers to a substrate holder and the reference number 42 refers to a substrate.

In the magnetic multi-layer film manufacturing apparatus 10 of the above-described configuration, a substrate 43, carried into the inner part by means of the loading/unloading chamber 15, is introduced in an order established in advance—in accordance with the type of magnetic multi-layer film device to be formed which constitutes the target for manufacture—to the robotic transferring device 11, the film-depositing chambers 17A, 17B and 17C, the oxide film film-depositing chamber 18 and the cleaning chamber 19 respectively, and in each chamber, processing such as etching and the predetermined film deposition is performed. Examples of the magnetic multi-layer film device to be formed, which constitutes the target for manufacture, include MRAM, TMR heads and advanced GMR (improved type).

Figure 2:
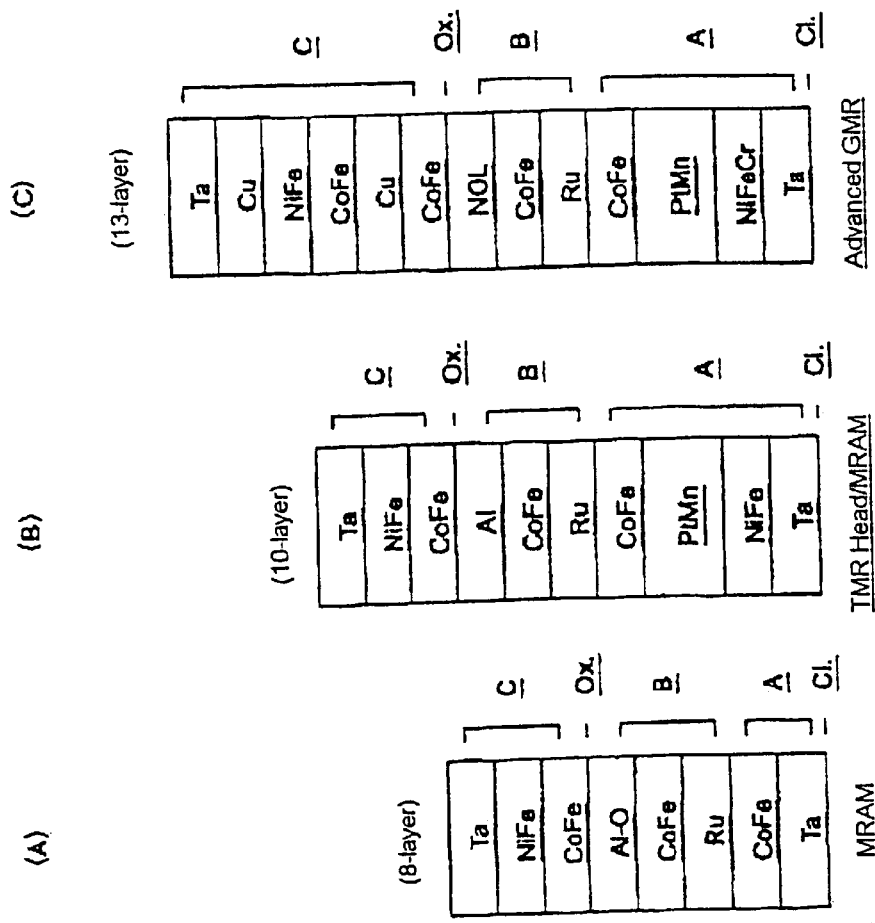

FIG. 2 shows an example of the above-described device comprising a magnetic multi-layer film-depositing structure. In FIG. 2(A) shows an 8-layer MRAM, FIG. 2(B) shows a 10-layer TMR head or MRAM, and FIG. 2(C) shows a 13-layer advanced GMR.

According to FIG. 2(A), the 8-layer MRAM is a deposition of magnetic films, in the order from the bottommost first layer to the uppermost eight layer, of Ta, CoFe, Ru, CoFe, Al—O, CoFe, NiFe and Ta. In this laminated state, the Ta (first layer) and CoFe (second layer) belong to group A, the Ru (third layer), CoFe (fourth layer) and Al—O (fifth layer) belong to group B, and the CoFe (sixth layer), NiFe (seventh layer) and Ta (eighth layer) belong to group C. It will be noted that a cleaning etching (shown by the symbol "Cl." in the diagram) is performed below the first layer Ta. In addition, oxide-processing of an Al film (shown by the symbol "Ox." in the diagram) is performed between the fifth layer Al—O and the sixth layer CoFe and, as a result, the Al—O forms an Al oxide layer. It will be noted that the aluminum oxide film (Al—O) may be manufactured by a reactive sputtering method using $O_2$ gas on the Al target. This applies to the other multi-layer films as well.

According to FIG. 2(B), the 10-layer TMR head or MRAM is a deposition of magnetic films, in the order from the bottommost first layer to the uppermost tenth layer, of Ta, NiFe, PtMn, CoFe, Ru, CoFe, Al—O, CoFe, NiFe and Ta. In this laminated state, the Ta (first layer), NiFe (second layer), PtMn (third layer) and CoFe (fourth layer) belong to group A, the Ru (fifth layer), CoFe (sixth layer) and Al—O (seventh layer) belong to group B, and the CoFe (eighth layer), NiFe (ninth layer) and Ta (tenth layer) belong to group C. It will be noted that a cleaning etching (Cl.) is performed below the first layer Ta. In addition, oxide-processing (Ox.) is performed between the seventh layer Al—O and eighth layer CoFe, wherein the Al—O forms an Al oxide layer. Although this is different by comparison to the 8-layer MRAM shown in FIG. 2(A) in terms of the addition of the NiFe and PtMn as the second and third layers, the arrangement of the multi-layer film structure is otherwise the same.

According to FIG. 2(C), the 13-layer advanced GMR is a deposition of magnetic films, in the order from the bottommost first layer to the uppermost thirteenth layer, of Ta, NiFeCr, PtMn, CoFe, Ru, CoFe, NOL (Nano Oxide Layer: such as CoFe—O), CoFe, Cu, CoFe, NiFe, Cu and Ta. In this laminated state, the Ta (first layer), NiFeCr (second layer), PtMn (third layer) and CoFe (fourth layer) belong to group A, the Ru (fifth layer), CoFe (sixth layer) and NOL (seventh layer) belong to group B, and the CoFe (eighth layer), Cu (ninth layer), CoFe (tenth layer), NiFe (eleventh layer), Cu (twelveth layer) and Ta (thirteenth layer) belong to group C. It will be noted that a cleaning etching of the (Cl.) is performed below the first layer Ta. In addition, oxide-processing (Ox.) is performed between the sixth layer CoFe and eight layer CoFe and, as a result, a very thin oxide film of NOL (Nano Oxide Layer) is formed as a seventh layer.

As is described above, the film deposition of each of the magnetic multi-layer film devices is performed by the division of the laminated magnetic films into 3 groups A, B and C, with the continuous deposition of a plurality of magnetic films belonging to each group. The magnetic films belonging to group A are formed successively in the film-depositing chamber 17A, the magnetic films belonging to group B are deposited successively in the film-depositing chamber 17B, and the magnetic films belonging to group C are deposited successively in the film-depositing chamber 17C. Furthermore, the film deposition of the oxide film is performed in the oxide film film-deposition chamber 18, and the cleaning etching is implemented in the cleaning chamber 19.

In the manufacture of the above-described 8-layer MRAM using the above-described multi-layer magnetic film manufacturing apparatus 10, the substrate carried into the apparatus is introduced first to the cleaning chamber 19 wherein an etching processing, in order to smooth the substrate surface, is performed using an ion beam or the like, the substrate is then introduced to the film-depositing chamber 17A whereupon the first layer and second layer of group A, employing successive targets, are deposited by continuous sputtering, following this, the substrate is introduced to the film-depositing chamber 17B where the second layer to the fifth layer of group B, employing successive targets, are deposited by continuous sputtering, after which the substrate is introduced to the oxide film film-depositing chamber 18 where an oxide film (aluminum layer) is deposited, wherein the substrate is finally introduced to the film-depositing chamber 17C where the sixth layer to the eight layer of group C, employing successive targets, are deposited by continuous sputtering.

Referring to FIG. 2, the manufacture of the above-described 10-layer TMR head/MRAM and 13-layer advanced GMR described above is performed in the same way, using the above-described magnetic multi-layer film manufacturing apparatus 10. The deposition of the magnetic multi-layer film is performed continuously by sputtering film deposition using the film-depositing chambers 17A, 17B and 17C correspondent to each group.

Film deposition of magnetic multi-layer films manufactured by, as described above, the continuous deposition of multi-layer magnetic films from the bottommost layer to the uppermost layer using a single large-scale film-depositing chamber, can be achieved by the partitioning of said magnetic multi-layer film into a specified plurality of groups of magnetic films, and the employment of a film depositing chamber which uses a different environment for the plurality of magnetic films of each group. Based on this knowledge, in a cluster-type magnetic multi-layer film manufacturing apparatus, as described above, film deposition is performed by the employment of a plurality of film-depositing chambers for sputtering film formation and the partitioning of the multi-layer magnetic films into groups. Although it is preferable that the method of partition of the multi-layer magnetic films, as shown in FIG. 2, involve separation into 3 groups A, B and C, this is not limited thereto and it is preferable that, as a reference criterion for the method of division of the groups, a division be performed between a metal oxide film (by way of example Al—O) and a magnetic layer continuous therewith, and that film deposition of the Anti-Ferro layer (antiferromagnetic layer, for example PtMn layer) and the magnetic layer continuous therewith (mainly CoFe layer) be performed continuously within the same film-depositing chamber. Furthermore, from the standpoint of the separation of the film-depositing chambers, it is preferable that, in the case where an oxide process is entered into in the course of the deposition, the separation of the lamination occur around the oxide process. Furthermore, the fact that the laminate number for the film-depositing chambers is preferably be equally distributed, must be considered.

In addition, although the same magnetic film (for example CoFe) is deposited in the respectively different film-depositing chambers 17A, 17B and 17C, the efficiency of the film deposition is increased by the adoption of a film-depositing system in which a single chamber performs a single passing. In addition, using the configuration of the cluster-type magnetic multi-layer manufacturing film device of the above-described configuration, the manufacture of magnetic film devices with various multi-layer film structures can be dealt with.

As is described above, by the separation of the magnetic multi-layer films into groups and the performing of sputtering film deposition using different film-depositing chambers for each group, the following film performance improvements can be achieved. By way of example, for a spin-valve GMR film laminated on a substrate from the bottom side in the order Ta (5 nm), NiFe (2 nm), PtMn (20 nm), CoFe (2 nm), Ru (0.85 nm), CoFe (2.5 nm), Cu (3 nm), CoFe (1 nm), NiFe (3 nm) and Ta (3 nm), in the case where continuous film deposition of all layers is performed, a 7.39% MR ratio can be achieved. In contrast to this, in the case of separate film deposition in which there is interruption between the PtMn layer (third layer) and CoFe layer (fourth layer), the MR ratio is reduced to 6.67%. For this reason, it is preferable that film deposition of the antiferromagnetic layer and the magnetic layer continuous therewith be continuously performed within the same film-depositing chamber. Furthermore, in the case of separate film deposition in which there is interruption between the Ru layer (fifth layer) and CoFe layer (sixth layer) the MR ratio is 7.45%, in the case of separate film deposition in which there is interruption between the CoFe layer (sixth layer) and Cu layer (seventh layer) the MR ratio is 7.66%, in the case where separate film deposition is performed in which there is interruption between the Cu layer (seventh layer) and the CoFe layer (eight layer) the MR ratio is 7.67%. In such cases, there is an interface that improves the MR ratio. By virtue of this fact, it is not always the case that continuous film deposition of all layers using the same film-depositing chamber is necessary, and in consideration of improvements to characteristics and productivity, it is desirable that the magnetic multi-layer film be divided into groups, a plurality of film-depositing chambers be provided, and separate film deposition be performed.

Figure 3:
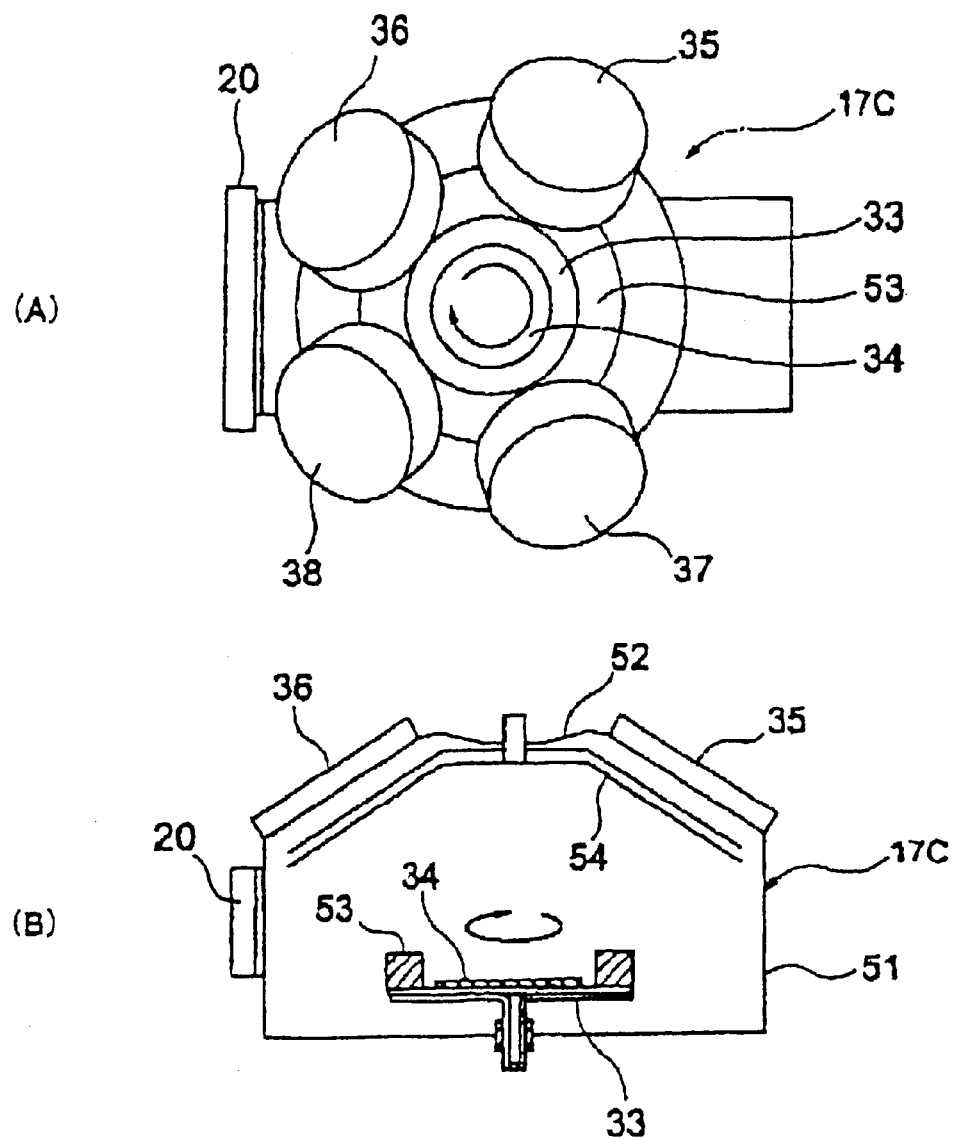
FIG. 3(A) is a plane surface view.
FIG. 3(B) is a cross-sectional surface view which schematically show the configuration of a single film-depositing chamber of the magnetic multi-layer film manufacturing apparatus pertaining to the present invention.

Next, a detailed description, based on FIG. 3, will be given of a representative structure provided in the film-depositing chambers 17A, 17B and 17C respectively. FIG. 3(A) is a plane surface view of, for example, the film-depositing chamber 17C, and FIG. 3(B) is a cross-sectional surface view thereof showing the representative structure. In FIG. 3, the same reference numbers are assigned to those elements that are essentially the same as those described by FIG. 1. As is described above, four targets 35 to 38 are provided in a ceiling part 52 of a receptacle 51 for the film-depositing chamber 17C. These targets 35 to 38 are fixed to the ceiling part 52 in an inclined state. A substrate holder 33, on which the substrate 34 is mounted in a horizontal state, is provided with freedom to rotate in the center of the base surface part of the film-depositing chamber 17C. During the sputtering film deposition on the substrate 34, the substrate 34 is in the rotated state. It will be noted that a ring-shaped magnet 53 is deployed in the perimeter of the substrate 34 on the substrate holder 33. The incline-provided targets 35 to 38 are arranged in a position facing the upper surface of the horizontally arranged substrate 34. A shutter mechanism 54 is arranged between the targets and the substrate 34. This shutter mechanism 54 comprises a double-layer shutter. Those targets among the four targets 35 to 38 to be used for sputtering film deposition are selected by the operation of the shutter mechanism 54. By virtue of this configuration, an oblique incidence of the target materials is attained, a highly uniform film thickness distribution is achieved in the multi-layer film deposition, and the generation of contamination between the targets and contamination between the magnetic fields is prevented.

Figure 4:
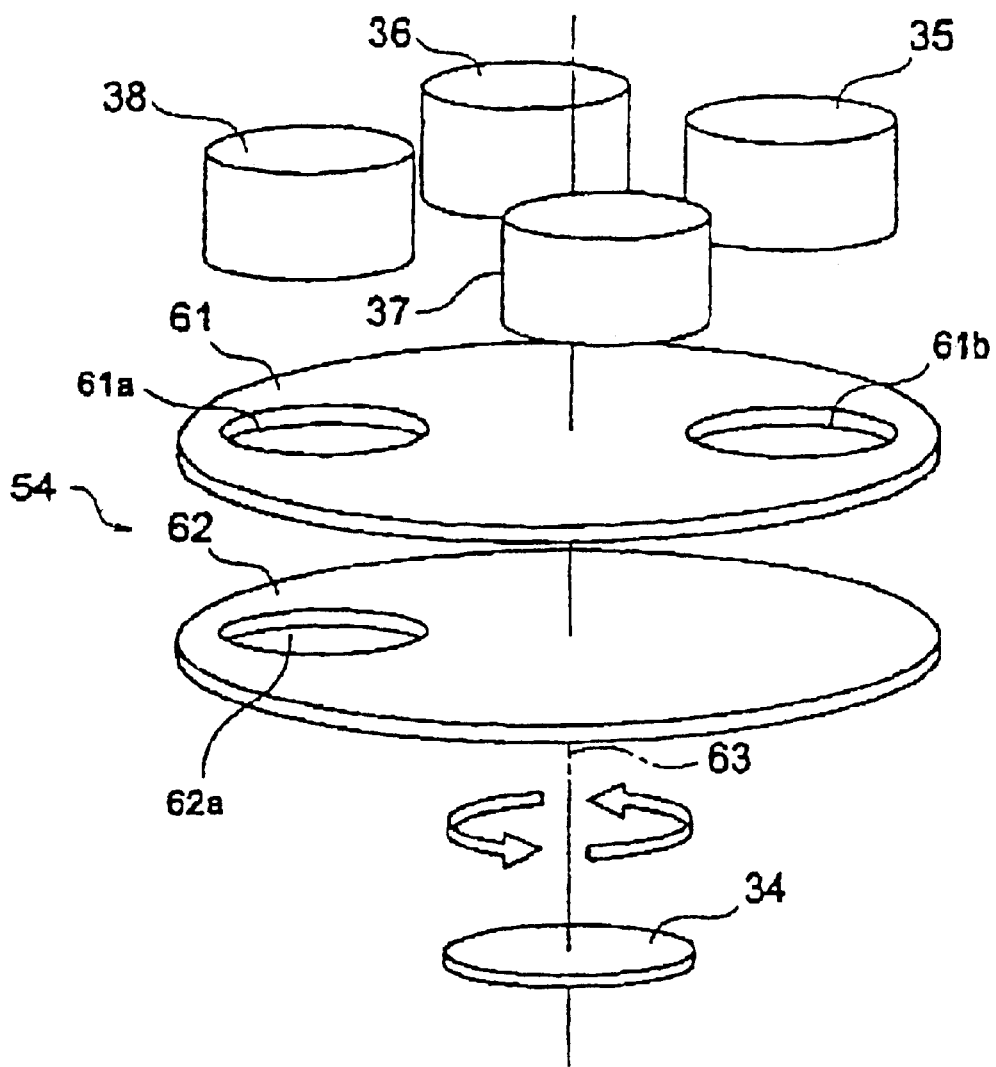
FIG. 4 is an explanatory diagram that schematically shows the double shutter mechanism based on the present invention.

A more detailed conceptual description follows, with reference to FIG. 4, of the operation and structure of the shutter mechanism 54. The shutter mechanism 54 is configured as a double-layer rotating shutter. This illustrated example shows, for brevity of description, a state in which the four targets 35, 36, 37, and 38 are in the horizontally arranged state. In the shutter mechanism 54, two shutter plates 61, 62, arranged essentially horizontally, are respectively provided in such a way that they can be separately rotated with freedom around an axis 63. Two holes 61*a*, 61*b*, aligned in the radial direction, are formed in the shutter plate 61, and one hole 62*a* is formed in the shutter plate 62. The shutter plate 61 with two holes 61a, 61b can be positioned closer to the targets 35, 36, 37, 38 than the shutter plate 62 with one hole 62a. Alternatively, the shutter plate 61 with two holes 61a, 61b can be positioned further from the targets 35, 36, 37, 38 than the shutter plate 62 with one hole 62a.

In the state shown in FIG. 4, sputtering film deposition, which uses the target 38 by superposing the position of the hole 62a of the shutter plate 62 and the hole 61a of the shutter plate 61 on the target 38, is performed, wherein a predetermined magnetic film is deposited on the surface of the substrate 34 during rotation. At this time, the targets 36, 37 are covered by the two shutter plates 61, 62, and the attachment of the sputtered target material is prevented. In addition, although the target 35 opposes the hole 61b in the shutter plate 61, because it is covered by the shutter plate 62, it is similarly protected.

Similarly, where the shutter plate 61 with two holes 61a, 61b is positioned further from the targets 35, 36, 37, 38 than the shutter plate 62 with one hole 62a, the targets 35, 36, 37 are covered by the shutter plate 62 and the target 38 is exposed for sputtering on the substrate 34.

Cross-contamination between the targets can be prevented by the shutter plates 61, 62 that comprise the double rotating shutters as described above. For example, in the case of a single shutter mechanism, a hole of the single shutter moves from one target to a net target. When the targets are spaced sufficiently close (i.e., separated by less than a diameter of the shutter hole), the shutter hole simultaneously exposes a portion of two targets during the rotation. In a double shutter mechanism, the exposure of more than one target can be prevented. FIGS. 5(A)–(C) sequentially depicts the position of the double shutter mechanism with respect to a target 35 during operation. In FIG. 5(A), no targets are exposed for operation. Target 35 is superposed by the one hole 62a of the shutter plate 62 and target 36 is superposed by one hole 61a of the shutter plate 61. The second hole 61b of shutter plate 61 is not shown. At this time sputter discharge can begin and is called "pre-sputter" and can be used to clean the surface of the target. Shutter plate 61 is rotated to align hole 61a with target 35 and hole 62a of shutter plate 62. During this rotation, as seen in FIG. 5(B), the targets 35, 36 are not exposed until the hole 61a begins to align with hole 62a. In this manner, only one target is exposed at any one time. Since, the sputter discharge continues during the rotation, this procedure prevents multiple targets from being exposed at any one time with the attendant sputtering of more than one material on the substrate. Finally, the hole 61a of the shutter plate 61 and the hole 62a of the shutter plate 62 align over the target 35 and sputtering of the target continues for a predetermined time period and a predetermined magnetic film is deposited on the surface of the substrate 34. Subsequent shutter manipulations can occur using the same procedure and with the same benefits as describe herein.

Additionally, during rotation there is a likelihood that a portion of the material accumulated on the surface of the shutter can be dislodged and contaminate the substrate. By a double shutter mechanism, the contamination can be reduced. For example, in a double shutter mechanism with a shutter plate with two holes closest the targets, the shutter plate with two holes can be rotated to a final sputtering position and any material dislodged can be prevented from contaminating the substrate by the position and operation of the shutter plate with one hole which is positioned below the shutter plate with two holes. Additionally, in a double shutter mechanism with a shutter plate with one hole closest the targets, the shutter plate can block more contamination than a shutter plate with two holes and thereby can reduce the amount of contaminant reaching the substrate. Further, the layer formed from the pre-sputter on the shutter plate having one hole is more continuous than that formed on a shutter plate having two holes and can be easy to remove and clean. Also, by not having a second hole, the pre-sputter layer tends to adhere to the surface better and for a longer period of time.

Although three film-depositing chambers 17A, 17B and 17C, for the dividing of the magnetic multi-layer film into three groups, are provided in the above-described embodiment mode, the number of divided groups is arbitrary, and the number of film-depositing chambers can also be arbitrarily set. In addition, there are no limits to the above-described embodiment mode in terms of the order of deposition of the multi-layer magnetic film, and this too can be arbitrarily set.

As sputtering film deposition of the multi-layer film involves division into groups, and the number of magnetic films continuously deposited using a single film-depositing chamber is reduced, the smoothness of the film can be improved, and the quality of the film can be increased.

As is clear in the description above, based on the present invention, in the manufacture of magnetic multi-layer films such as MRAM and magnetic heads comprising TMR elements, because the multi-layer film is divided into a plurality of groups and sputtering film deposition is performed on the magnetic films of each group using a single common film-depositing chamber, with regard to the magnetic multi-layer film manufacturing apparatus, a normal cluster-type film-depositing device can be attained as a semiconductor multi-layer film manufacturing apparatus and, more particularly, a magnetic multi-layer film manufacturing apparatus suitable for the semiconductor method used by semiconductor manufacturers can be attained, and furthermore, film performance can be increased, and productivity can be improved. In addition, by the provision of a double shutter structure, cross-contamination between the targets can be prevented.

While the present invention has been described by reference to the abovementioned embodiments, certain modifications and variations will be evident to those of ordinary skill in the art. Therefore, the present invention is to limited only by the scope and spirit of the appended claims.

What is claimed is:

1. A method of forming a magnetic multi-layer film, the method comprising:

positioning a substrate into a first film deposition chamber from a carrying chamber in operational communication therewith;

depositing a first magnetic film group, the first magnetic film group comprising a first plurality of magnetic layers, each magnetic layer deposited successively on the substrate continuously in a laminated state to form a magnetic multi-layer film while the substrate is in the first film deposition chamber;

positioning the magnetic multi-layer film into at least a second film deposition chamber; and depositing a second magnetic film group, the second magnetic film group comprising a second plurality of magnetic layers, each magnetic layer deposited successively on the magnetic multi-layer film continuously in a laminated state to form a stacked magnetic multi-layer film while the substrate is in the second film deposition chamber;

further comprising selecting a division between one of the magnetic film groups and another of the magnetic film groups, the division selected to be between a metal oxide film of the one of the magnetic film groups and a magnetic layer of the another of the magnetic film groups adjacent therewith.

2. The method of claim 1, further comprising:
positioning the substrate in a cleaning chamber from the carrying chamber in operational communication therewith; and
cleaning the substrate by an etching or a sputtering technique.

3. The method of claim 1, further comprising depositing at least one non-magnetic film in at least one of the groups.

4. The method of claim 3, wherein the non-magnetic film is an oxide film or a nano-oxide layer.

5. The method of claim 1, wherein depositing is by a physical vapor deposition technique or a RF sputtering technique.

6. The method of claim 1, wherein the stacked magnetic multi-layer film structure is a MRAM, a TMR head, or a GMR structure.

7. A method of forming a magnetic multi-layer film, the method comprising:
positioning a substrate into a first film deposition chamber from a carrying chamber in operational communication therewith;
depositing a first magnetic film group, the first magnetic film group comprising a first plurality of magnetic layers, each magnetic layer deposited successively on the substrate continuously in a laminated state to form a magnetic multi-layer film while the substrate is in the first film deposition chamber;
positioning the magnetic multi-layer film into at least a second film deposition chamber; and
depositing a second magnetic film group, the second magnetic film group comprising a second plurality of magnetic layers, each magnetic layer deposited successively on the magnetic multi-layer film continuously in a laminated state to form a stacked magnetic multi-layer film while the substrate is in the second film deposition chamber;
wherein within any one of the magnetic film groups, an antiferromagnetic layer is deposited adjacent a magnetic layer continuously within any one of the film deposition chambers.

8. The method of claim 7, wherein the magnetic layer is on the antiferromagnetic layer.

9. The method of claim 7, wherein within any one of the magnetic film groups, the magnetic layer is deposited on one side of the antiferromagnetic layer and another layer is deposited on another side of the antiferromagnetic layer continuously within any one of the film deposition chambers.

10. A method of forming a magnetic multi-layer film, the method comprising:
positioning a substrate into a first film deposition chamber from a carrying chamber in operational communication therewith;
depositing a first magnetic film group, the first magnetic film group comprising a first plurality of magnetic layers, each magnetic layer deposited successively on the substrate continuously in a laminated state to form a magnetic multi-layer film while the substrate is in the first film deposition chamber;
positioning the magnetic multi-layer film into at least a second film deposition chamber; and
depositing a second magnetic film group, the second magnetic film group comprising a second plurality of magnetic layers, each magnetic layer deposited successively on the magnetic multi-layer film continuously in a laminated state to form a stacked magnetic multi-layer film while the substrate is in the second film deposition chamber;
positioning the magnetic multi-layer film or stacked magnetic multi-layer film in an oxidizing chamber from the carrying chamber in operational communication therewith; and
oxidizing a metal layer.

11. The method of claim 10, wherein the metal layer is between any successive magnetic film groups.

12. A method of forming a magnetic multi-layer film, the method comprising:
positioning a substrate into a first film deposition chamber from a carrying chamber in operational communication therewith;
depositing a first magnetic film group, the first magnetic film group comprising a first plurality of magnetic layers, each magnetic layer deposited successively on the substrate continuously in a laminated state to form a magnetic multi-layer film while the substrate is in the first film deposition chamber;
positioning the magnetic multi-layer film into at least a second film deposition chamber; and
depositing a second magnetic film group, the second magnetic film group comprising a second plurality of magnetic layers, each magnetic layer deposited successively on the magnetic multi-layer film continuously in a laminated state to form a stacked magnetic multi-layer film while the substrate is in the second film deposition chamber;
wherein the stacked magnetic multi-layer film structure has a MR ratio of at least 7%.

13. The method of claim 12, wherein the stacked magnetic multi-layer film structure has a MR ratio of at least about 7.5%.

14. A method of forming a magnetic multi-layer film, the method comprising:
introducing a substrate into a carrying chamber having a plurality of deposition chambers in operational communication therewith and a manipulating device;
operating the manipulating device to place the substrate in a cleaning chamber;
cleaning the substrate by an etching or a sputtering technique;
operating the manipulating device to successively place the substrate in each of the plurality of deposition chambers in a predetermined sequence; and
depositing a plurality of magnetic film groups to form a magnetic multi-layer film, the plurality of magnetic film groups comprising a plurality of magnetic film layers, each one of the plurality of magnetic film groups continuously deposited in a laminated state in a respective one of the plurality of deposition chambers;
wherein the last of the plurality of magnetic film layers of one of the plurality of magnetic film groups comprises a metal oxide layer, and a first of the plurality of magnetic film layers of another of the plurality of magnetic film groups comprises a magnetic layer, the metal oxide layer and the magnetic layer deposited adjacent each other in different deposition chambers.

15. The method of claim 14, wherein depositing is by a physical vapor deposition technique or a RF sputtering technique.

16. The method of claim 14, wherein the plurality of magnetic films form a MRAM, a TMR head, or a GMR structure.

17. A method of forming a magnetic multi-layer film, the method comprising:
   introducing a substrate into a carrying chamber having a plurality of deposition chambers in operational communication therewith and a manipulating device;
   operating the manipulating device to place the substrate in a cleaning chamber;
   cleaning the substrate by an etching or a sputtering technique;
   operating the manipulating device to successively place the substrate in each of the plurality of deposition chambers in a predetermined sequence;
   depositing a plurality of magnetic film groups to form a magnetic multi-layer film, the plurality of magnetic film groups comprising a plurality of magnetic film layers, each one of the plurality of magnetic film groups continuously deposited in a laminated state in a respective one of the plurality of deposition chambers; and
   oxidizing a metal layer between successive divisions.

18. A method of forming a magnetic multi-layer film, the method comprising:
   introducing a substrate into a carrying chamber having a plurality of deposition chambers in operational communication therewith and a manipulating device;
   operating the manipulating device to place the substrate in a cleaning chamber;
   cleaning the substrate by an etching or a sputtering technique;
   operating the manipulating device to successively place the substrate in each of the plurality of deposition chambers in a predetermined sequence;
   depositing a plurality of magnetic film groups to form a magnetic multi-layer film, the plurality of magnetic film groups comprising a plurality of magnetic film layers, each one of the plurality of magnetic film groups continuously deposited in a laminated state in a respective one of the plurality of deposition chambers; and
   depositing at least one non-magnetic film in at least one of the plurality of groups.

19. The method of claim 18, wherein the non-magnetic film is an oxide film or a nano-oxide layer.

20. A method of forming a magnetic multi-layer film, the method comprising:
   introducing a substrate into a carrying chamber having a plurality of deposition chambers in operational communication therewith and a manipulating device;
   operating the manipulating device to place the substrate in a cleaning chamber;
   cleaning the substrate by an etching or a sputtering technique;
   operating the manipulating device to successively place the substrate in each of the plurality of deposition chambers in a predetermined sequence;
   depositing a plurality of magnetic film groups to form a magnetic multi-layer film, the plurality of magnetic film groups comprising a plurality of magnetic film layers, each one of the plurality of magnetic film groups continuously deposited in a laminated state in a respective one of the plurality of deposition chambers; and
   wherein the magnetic multi-layer film structure has a MR ratio of at least 7%.

21. The method of claim 20, wherein the magnetic multi-layer film structure has a MR ratio of at least about 7.5%.

22. A magnetic multi-layer film manufacturing apparatus, comprising:
   a transferring chamber;
   a plurality of film-depositing chambers in operative communication with the transferring chamber, each film-depositing chamber comprising a rotatable substrate holder, a plurality of targets, and a double layer rotating shutter mechanism disposed between the rotatable substrate holder and the plurality of targets, each film-depositing chamber controllable to deposit at least one layer of a magnetic multi-layer film structure; and
   a robotic transferring device disposed in the transferring chamber, the robotic transferring device rotatable about a central location and freely stretchable.

23. The apparatus of claim 22, wherein the substrate holder has a ring shaped magnet disposed on a perimeter thereof.

24. The apparatus of claim 22, wherein the plurality of targets are positioned at an incline on an opposing interior surface from the substrate holder.

25. The apparatus of claim 22, wherein the double layer rotating shutter mechanism comprises a first and second shutter plate, each shutter plate separately rotatable about an axis, the first shutter plate having at least two openings therein aligned radially and the second shutter plate having one opening therein.

26. The apparatus of claim 22, wherein a distal end of the robotic transferring device extends to at least a position within each of the film depositing chambers corresponding to the substrate holder.

27. The apparatus of claim 22, further comprising at least one load/unload chamber in operational communication with the central transferring chamber.

28. The apparatus of claim 22, wherein the plurality of film-depositing chambers in operative communication with the transferring chamber are disposed on the perimeter of the transferring chamber.

29. A deposition apparatus, comprising:
   a chamber comprising a housing for a target on a first surface; and
   a shutter mechanism, the shutter mechanism comprising a first platen having at least two openings therein and a second platen having an opening therein,
      wherein the first platen and second platen are arranged substantially coaxial and are each freely and independently rotatable about an axis within the chamber such that the opening in the first platen and the opening in the second platen are substantially longitudinally aligned with respect to a center axis of the housing for a target.

30. The apparatus of claim 29, wherein the first platen is arranged proximal to the housing for a target.

31. The apparatus of claim 29, wherein the second platen is arranged proximal to the housing for a target.

32. The apparatus of claim 29, wherein the first platen has two openings therein.

33. The apparatus of claim 29, wherein the opening on the second platen has a geometric form that corresponds in size and shape to the housing for a target.

34. A method of depositing material from a plurality of targets in a chamber, the method comprising:
   rotating a first platen having one opening to align the one opening with a first of a plurality of targets;
   rotating a second platen having at least two openings therein so that none of the openings are aligned with the first of the plurality of targets;

sputtering the first of the plurality of targets for a predetermined time;

rotating the second platen to align one of the at least two openings with the first target; and depositing material from the first of the plurality of targets onto a substrate.

35. The method of claim 34, further comprising:

rotating the second platen so that none of the at least two openings are aligned with the first of the plurality of targets and a second of a plurality of targets;

rotating the first platen to align the one opening with the second of a plurality of targets;

sputtering the second of the plurality of targets for a predetermined time;

rotating the second platen to align one of the at least two openings with the second target; and depositing material from the second of the plurality of targets onto a substrate.

36. The method of claim 34, further comprising rotating the substrate during the depositing.

37. A method of depositing material onto a substrate from a plurality of targets in a chamber that includes two rotatable platens arranged between the substrate and the plurality of targets, wherein a first of the two platens includes one opening therein and a second of the two platens includes at least two openings therein, the method comprising:

rotating the second of the two platens so that none of the openings are aligned with a first of the plurality of targets;

presputtering the first of the plurality of targets for a predetermined time with the second of the two platens arranged such that none of the openings are aligned with the first target;

rotating the second of the two platens to align one of the at least two openings with the first target; and sputtering the first target while the one of the at least two openings of the second of the two platens is aligned with the first target and while the first of the two platens is aligned such that the one opening of the first of the two platens is also aligned with the first target so as to deposit material from the first of the plurality of targets onto the substrate.

38. The method of claim 37, wherein the opening of the first platen is aligned with the first target during the presputtering.

* * * * *